(12) United States Patent
Pan et al.

(10) Patent No.: US 6,661,733 B1
(45) Date of Patent: Dec. 9, 2003

(54) DUAL-PORT SRAM IN A PROGRAMMABLE LOGIC DEVICE

(75) Inventors: Philip Y. Pan, Fremont, CA (US); Chiakang Sung, Milpitas, CA (US); Joseph Huang, San Jose, CA (US); Bonnie Wang, Cupertino, CA (US); Khai Nguyen, San Jose, CA (US); Xiaobao Wang, Santa Clara, CA (US); Gopinath Rangan, Santa Clara, CA (US); In Whan Kim, San Jose, CA (US); Yan Chong, Stanford, CA (US)

(73) Assignee: Altera Corporation, San Jose, CA (US)

( * ) Notice: Subject to any disclaimer, the term of this patent is extended or adjusted under 35 U.S.C. 154(b) by 139 days.

(21) Appl. No.: 09/883,087

(22) Filed: Jun. 15, 2001

Related U.S. Application Data

(60) Provisional application No. 60/211,936, filed on Jun. 15, 2000.

(51) Int. Cl.[7] .................................................. G11C 8/00
(52) U.S. Cl. .................................. 365/230.05; 365/154
(58) Field of Search ........................... 365/230.05, 154, 365/156, 189.01, 189.04

(56) References Cited

U.S. PATENT DOCUMENTS

| | | | | |
|---|---|---|---|---|
| 5,307,322 A | * | 4/1994 | Usami et al. | 365/230.05 |
| 6,044,034 A | * | 3/2000 | Katakura | 365/230.05 |
| 6,400,635 B1 | * | 6/2002 | Ngai et al. | 365/230.05 |

* cited by examiner

Primary Examiner—Anh Phung
(74) Attorney, Agent, or Firm—Townsend and Townsend and Crew LLP

(57) ABSTRACT

Methods and apparatus for a dual-port SRAM in a programmable logic device. One embodiment provides a programmable logic integrated circuit including a dual-port memory. The memory includes a plurality of memory storage cells, and each memory storage cell has a memory cell having a first node and a second node, a first series of devices connected between a first data line and the first node of the memory cell, and a second series of devices connected between a second data line and the second node of the memory cell. A read cell is connected to the second node of the memory cell. A word line is connected to a first device in the first series of devices, a second device in the second series of devices, and the read cell.

33 Claims, 13 Drawing Sheets

DUAL-PORT SRAM IN A PROGRAMMABLE LOGIC DEVICE

CROSS-REFERENCES TO RELATED APPLICATIONS

This application claims the benefit of U.S. provisional patent application No. 60/211,936, filed Jun. 15, 2000, which is incorporated by reference along with all other documents listed in this application.

BACKGROUND OF THE INVENTION

The present invention relates to the field of integrated circuits and in particular, to a dual-port memory within a programmable logic integrated circuit.

Programmable logic integrated circuits such as PALs, PLDs, FPGAs, LCAs, and others are becoming more complex and continually evolving to provide more user-programmable features on a single integrated circuit. Modem programmable logic integrated circuits incorporate programmable logic including logic gates, products terms, or look-up tables. Programmable logic integrated circuits also include embedded user-programmable memory or RAM.

Despite the success of programmable logic, there is a continuing desire to provide greater functionality in a programmable logic integrated circuit, and at the same time, to provide greater flexibility. There is a need to provide higher performance user memories. Specifically, the memories need to be configurable to meet customer demands for FIFOs, CAMs, RAMs, product terms, and ROMs. Also, for greatest flexibility, the memory should be a true dual-port, capable of either reading or writing from both ports at the same time. Read-during-write functionality should be supported. Moreover, the memory ports should be configurable to meet the requirements of the application designed in the programmable logic.

What is needed is a highly flexible memory, which may be configured into a number of different memory function types, and is capable of supporting read-during-write operations.

SUMMARY OF THE INVENTION

The present invention provides circuitry and techniques for efficiently and effectively implementing a read-during-write feature for memory blocks. In a specific embodiment, the memory blocks are the dual-port SRAM memory blocks of a programmable logic integrated circuit.

The implementation of the memory cell used in the memory blocks provides good noise immunity by careful selection of the order of devices in write circuits. Routing is simplified, and operation is improved by sharing a word line between read and write circuits. A differential write is provided to improve write times. The placement of a write enable signal also aids in read-during-write functions. A configurable input allows applications in a programmable logic portion of a programmable logic device to select different word lengths.

The memories may be configured as a ROM, RAM, FIFO, CAM, or product terms.

An exemplary embodiment provides a programmable logic integrated circuit. The integrated circuit includes a dual-port memory having a plurality of memory storage cells, each memory storage cell having a memory cell having a first node and a second node. A first series of devices coupled between a first data line and the first node of the memory cell, and a second series of devices coupled between a second data line and the second node of the memory cell are also included. A read cell is coupled to the second node of the memory cell, and a word line is coupled to the gate of a first device in the first series of devices, the gate of a second device in the second series of devices, and the read cell.

Another exemplary embodiment provides a programmable logic integrated circuit. This integrated circuit includes a dual-port memory having a plurality of memory storage cells. Each memory storage cell includes a first device coupled to a first data line, and having a gate coupled to a first word line, a second device coupled between the first device and a first node of a memory cell, and having a gate coupled to a first column select line. A third device coupled to a second node of the memory cell, and having a gate coupled to the first column select line, and a fourth device coupled between the third device and a first complementary data line, and having a gate coupled to the first word line are also included.

Yet a further exemplary embodiment provides a programmable logic integrated circuit having a plurality of logic elements, programmably configurable to implement user-defined combinatorial or registered logic functions, and a memory coupled to the plurality of logic elements. The memory includes a plurality of memory storage cells, each having a memory cell, a first differential write circuit coupled to memory cell, and selected by a word line, as well as a read cell coupled to the memory cell, and selected by the word line.

A method of writing to a dual-port memory in a programmable logic device consistent with an embodiment of the present invention includes providing a data bit on a data line, and a complement of the data bit on a complementary data line. A read/write word line is selected, thereby activating a first device coupled to the data line, and a second device coupled to the complementary data line. A column select line is selected, thereby activating a third device coupled between the first device and a first node of a memory cell, and a fourth device, coupled between the second device and a second node of the memory cell.

A further embodiment of the present invention provides a programmable logic integrated circuit including a plurality of programmable logic cells, and a dual-port memory coupled to the programmable logic cells. The memory has a plurality of memory cells, each having two write circuits and two read circuits coupled to a storage cell, and arranged in columns and rows, a column decoder, a word line decoder having a plurality of word lines, each word line coupled to one write circuit and one read circuit of each memory cell in a row. A sense amplifier block is also provided, and it includes a plurality of sense amplifiers, each coupled to a column of memory cells. The dual-port memory may be configured as a content addressable memory by bypassing the word line decoder, and providing a comparand input to the plurality of word lines.

Another embodiment provides a method of determining the presence of a match between a data entry and a comparand in a content addressable memory. The memory includes a plurality of memory cells arranged in rows and columns, each memory cell having a write circuit and a read circuit. The write circuit and the read circuit of each memory cell in a row is coupled to one word line, and the read cells of each memory cell in a column are coupled to one first read line and one second read line. The method itself includes writing the data entry to odd numbered memory cells in a column of memory cells, writing a complement of the data entry to even numbered memory cells in the column of memory cells, driving word lines coupled to the even numbered memory cells in the column of memory cells with the comparand, and driving word lines coupled to the odd numbered memory cells in the column of memory cells with a complement of the comparand.

A better understanding of the nature and advantages of the present invention may be gained with reference to the following detailed description and the accompanying drawings.

DETAILED DESCRIPTION

Figure 1:
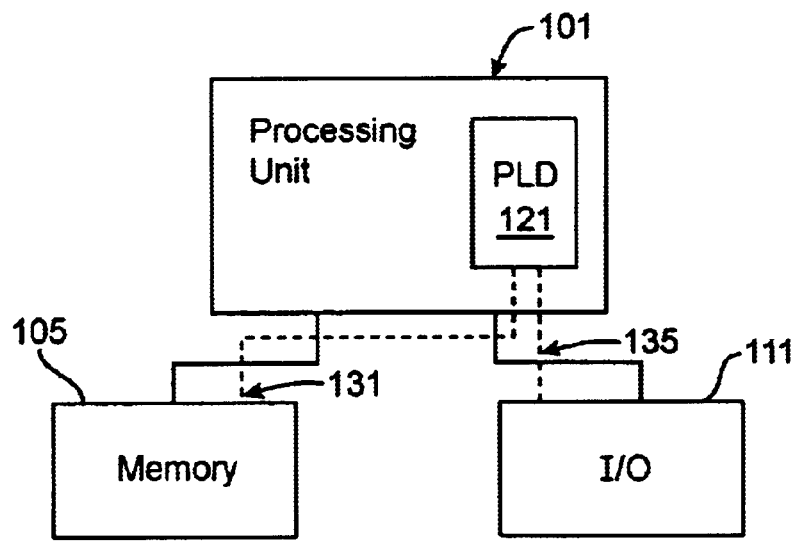
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. pat. Nos. 4,871,930, 5,241,224, 5,258,668, 5,260,610, 5,260,611, 5,436,575, and the Altera Data Book (1999), all incorporated by reference in their entirety for all purposes. Programmable logic integrated circuits and their operation are well known to those of skill in the art.

In the particular embodiment of FIG. 1, a processing unit 101 is connected to a memory 105 and an I/O 111 and incorporates a programmable logic device (PLD) 121. PLD 121 may be specially connected to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
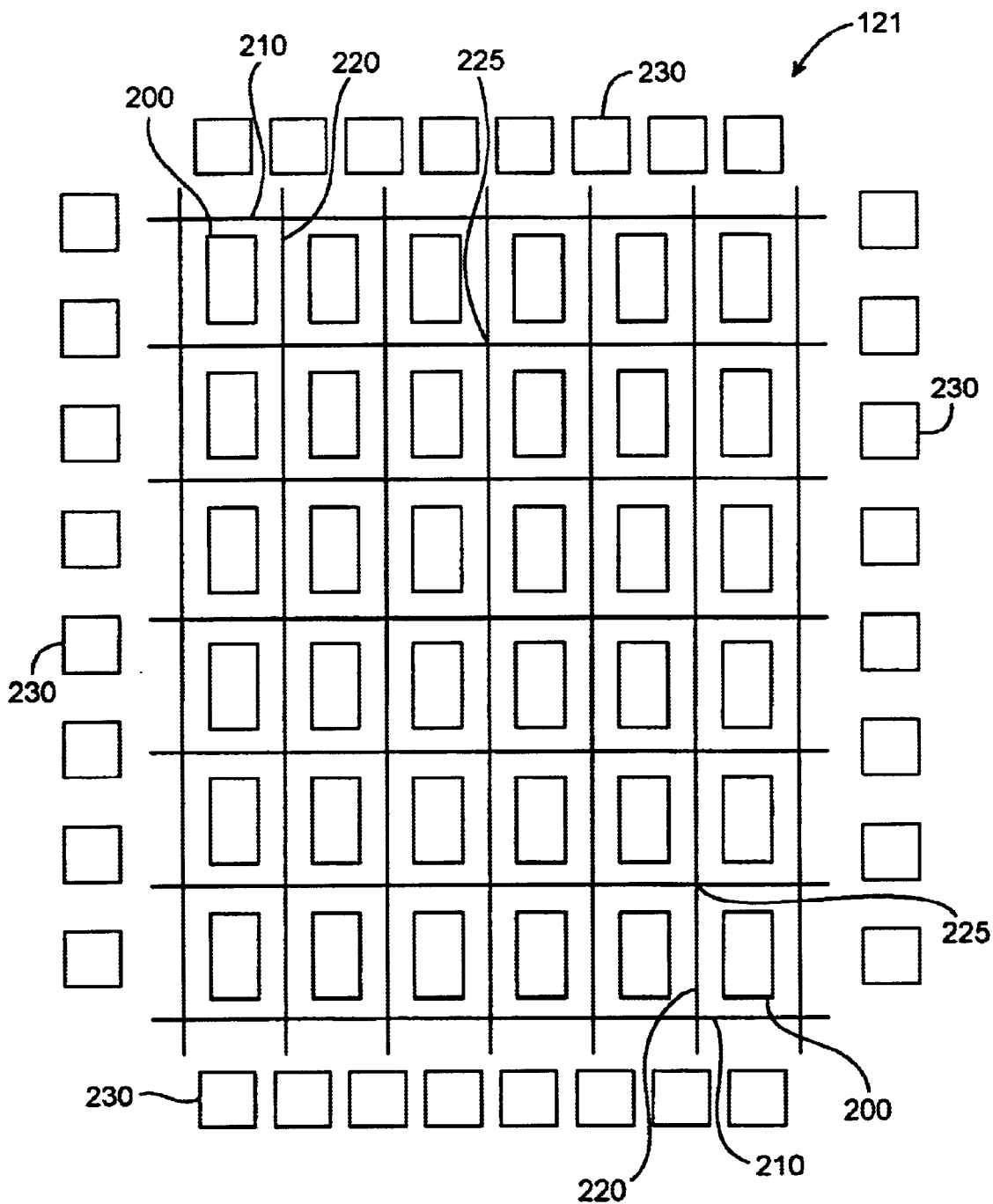
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

Figure 3:
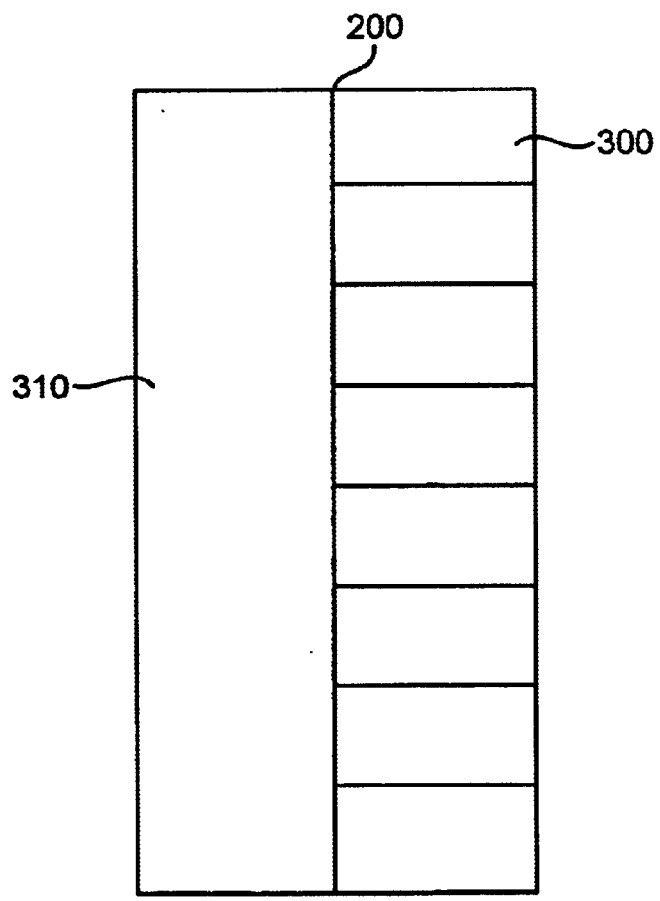
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
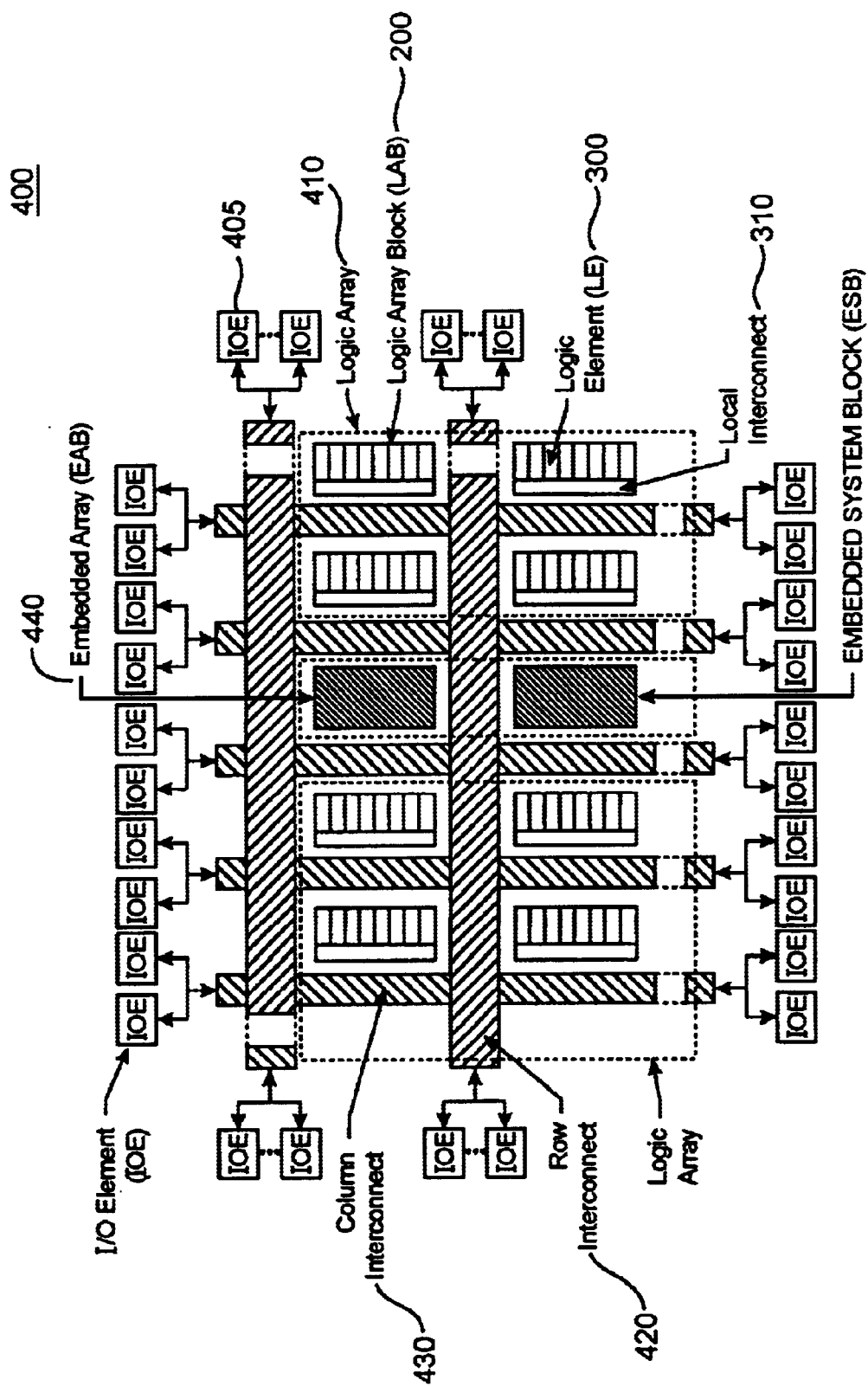
FIG. 4 shows an architecture of a programmable logic integrated circuit with embedded system blocks (ESBs)

FIG. 4 shows a PLD architecture similar to that in FIG. 2. The architecture in FIG. 4 further includes embedded system blocks (ESBs), or embedded array blocks (EABs). ESBs contain user memory, a flexible block of RAM. More discussion of this architecture may be found in the Altera Data Book (1999), and also in U.S. Pat. No. 5,550,782, which are incorporated by reference.

Figure 5:
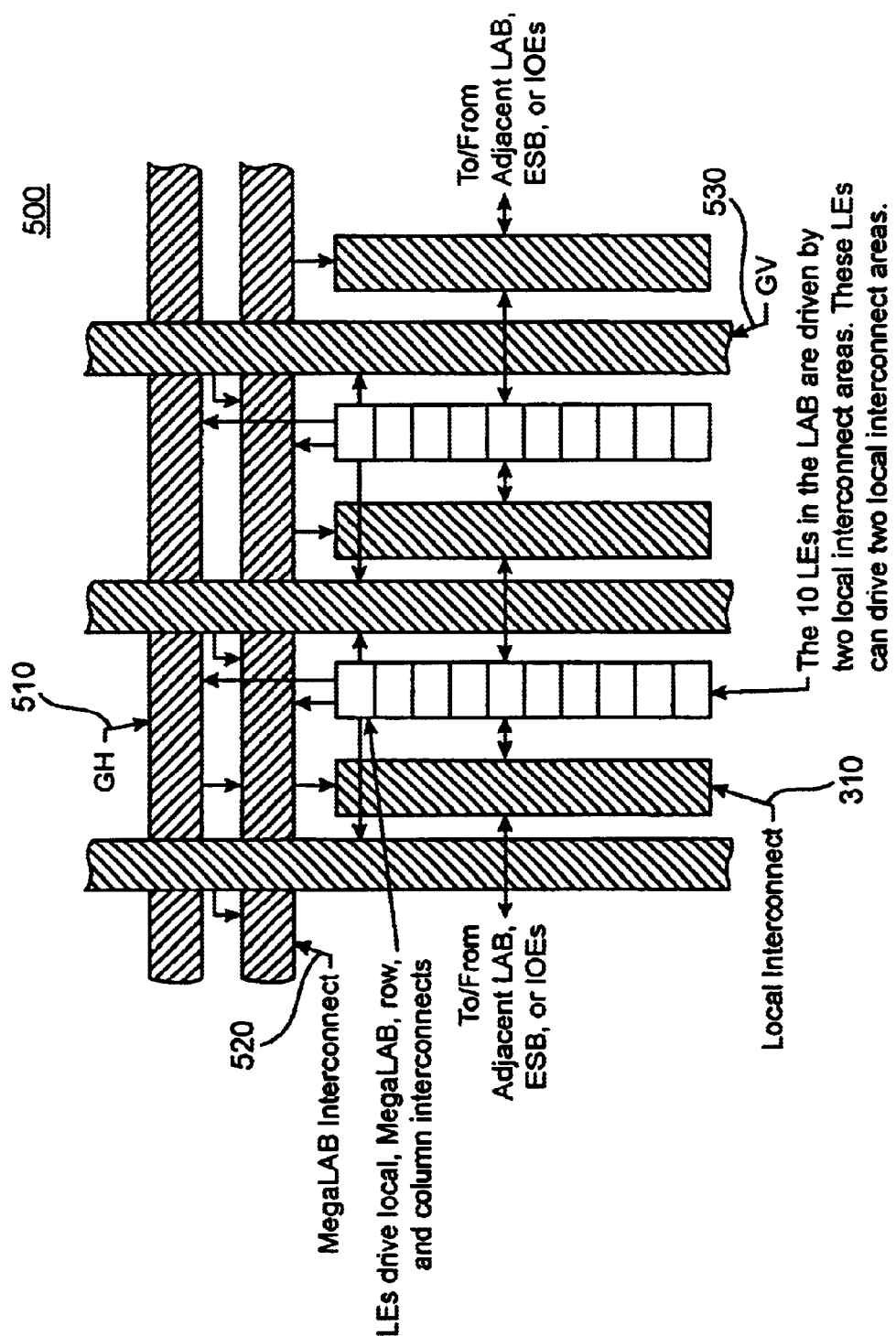
FIG. 5 shows an architecture of a programmable logic integrated circuit with megaLABs.

FIG. 5 shows a further embodiment of a programmable logic integrated circuit architecture. FIG. 5 only shows a portion of the architecture. The features shown in FIG. 5 are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 2, this architecture has an additional level of interconnect, the megaLAB interconnect. Such an architecture is found in Altera's APEX™ family of products, which is described in detail in the APEX 20K Programmable Logic Device Family Data Sheet (August 1999), which is incorporated by reference. In a specific implementation, a megaLAB also includes an embedded system block (ESB) to implement a variety of memory functions such as CAM, RAM, dual-port RAM, ROM, and FIFO functions.

Figure 6:
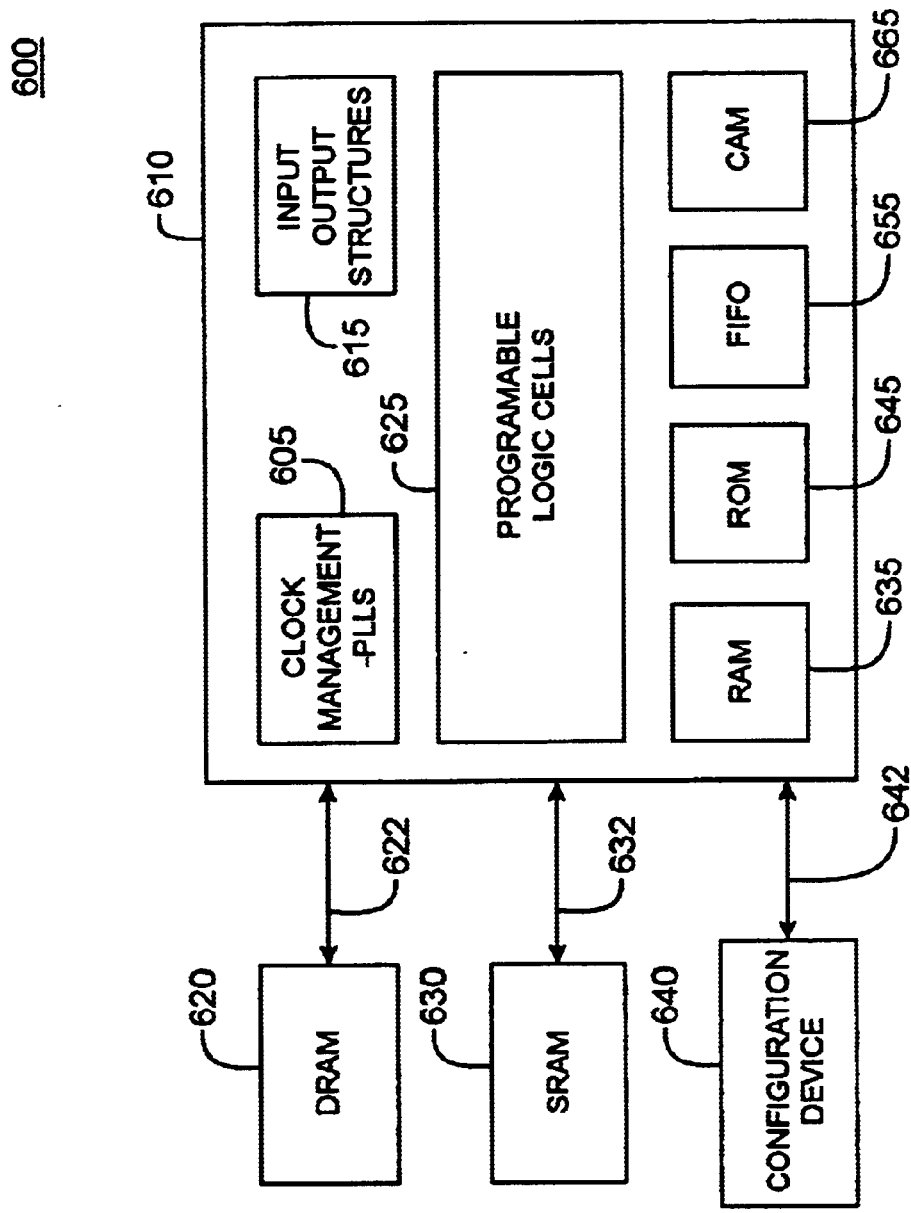
FIG. 6 is a block diagram of an electronic subsystem.

FIG. 6 is a block diagram 600 of an electronic subsystem. Included are programmable logic device 610, DRAM 620, SRAM 630, and configuration device 640. The DRAM 620 communicates with programmable logic device 610 using bus 622. SRAM 630 and configuration device 640 communicate with programmable logic device 610 using buses 632 and 642. Programmable logic device 610 includes a clock management block 605 made up of phase-locked loops (PLLs) and related circuitry, input output structures 615, programmable logic cells 625, and embedded system blocks 635–665, which may be configured into various memory types. These memory configurations may include a static random access memory (SRAM) 635, a read only memory (ROM) 645, first-in-first-out (FIFO) 655, or a content addressable memory (CAM) 665. The memories may be single or dual-port. DRAM 620 provides extra memory off-chip for use by the programmable logic device 610. Similarly, SRAM 630 provides high-speed memory for programmable logic device 610. Configuration device 640 stores information as to the configuration of the clock management block 605, input output structures 615, programmable logic cells 625, and the memory blocks 635, 645, 655, and 665.

The locations of the various blocks of the programmable logic device 610, as shown in this figure, do not reflect the floor plan of these devices. While the clock management block 605 may be in a corner of the die for noise and coupling reasons, the input output structures 615 are typically placed around the periphery of the device. Also, the embedded system blocks 635–665 are mixed with the programmable logic cells 625, such that the programmable logic cells 625 have easy access to the ESBs 635–665.

Figure 7:
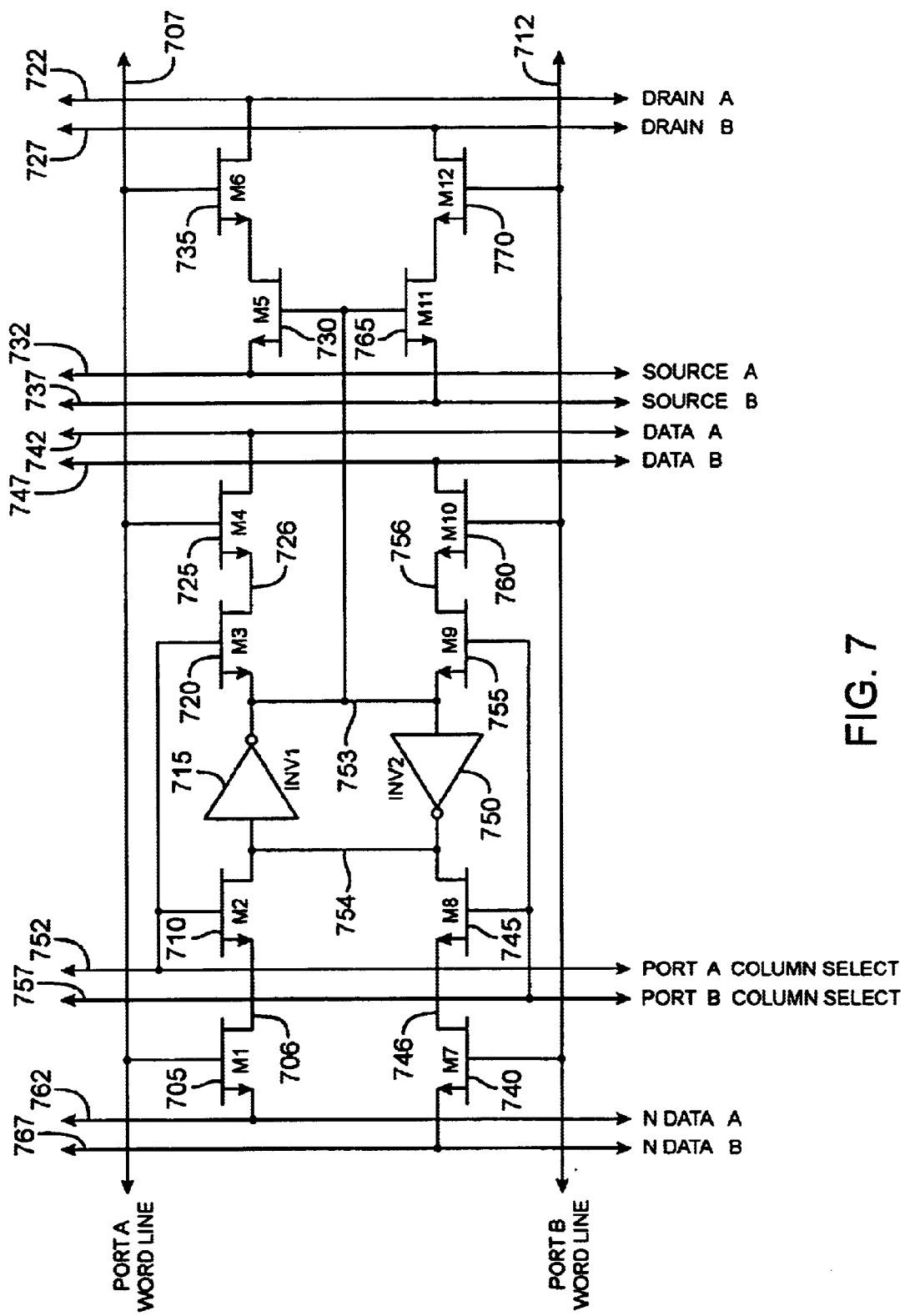
FIG. 7 is a schematic of a dual-port static random access memory (SRAM) storage cell circuit.

FIG. 7 is a schematic 700 of a dual-port static random access memory (SRAM) storage cell circuit. This SRAM storage cell may be used to achieve high noise immunity and to provide in addition to data storage of a RAM or ROM, multiple logic functions such as CAM, FIFO, LIFO, product terms (PT), and others. This SRAM cell significantly reduces charge sharing between bit lines and internal storage nodes in operation.

Included is a memory cell with its dual-port read and write circuits and their interconnections, which may be used in an embedded system block configured in one of the memory types discussed. Included are a memory cell including a first inverter 715 and a second inverter 750, cross coupled with the first inverter 715. Connected to the memory cell are differential data lines for Port A, Data A line 742 and N Data A line 762. Between the memory cell and the Data A line are series devices M3 720 and M4 725. Connected between the memory cell and the Data A line are devices M2 710 and M1 705. Devices M2 710 and M3 720 have gate electrodes tied to Port A column select line 752. Devices M1 705 and M4 725 have gates tied to Port A word line (or read/write word line) 707. Also connected to the memory cell is a separate read port including inverter device M5 730 in series with device M6 735. The gate of M6 735 is tied to Port A word line 707. Devices M5 730 and M6 735 are between a Source A line 732 and a Drain A line 722.

Read and write circuits for a second port, Port B are also connected to the memory cell. Series devices M9 755 and M10 760 are placed between the memory cell and a Data B line 745. Devices M8 745 and M7 740 are connected between the memory cell and N Data B line 765. The gates of M8 745 and M9 755 are tied to Port B column select line 757. The gates of M7 740 and M10 760 are tied to the Port B word line 712. A read circuit is included for Port B. Specifically, inverter device M11 765 is driven by the memory cell. M12 770 is in series with M11 765. The gate of M12 770 is connected to Port B word line 717. Devices M11 765 and M12 770 are connected in series between Source B line 735 and Drain B line 727.

Since there are two devices in series between the memory cell and the data lines, the memory cell is isolated from voltage switching on the data lines. For example, voltage spikes or glitches on a word line or column select line are not sufficient to allow transfer of a significant amount of charge between the data lines and the memory cell since there is a second device in series between the data lines and memory cell. Specifically, a glitch or spike on Port A column select line 752, which temporarily turns on or activates M2 710, is not enough to allow corruption of the memory cell data on line 754 by data line 762, since M1 705 is off or deactivated and in series with device M2 710. Moreover, the tendency in most applications is for a word line to remain selected as column lines are selected and deselected. This means that as device M2 710 is switched off and on in cells on deselected word lines, the memory cells are protected by off device M1 705.

A desirable feature for a SRAM cell is to allow read-during-write operation. In order to support "read-during-write" operations, and also simplify the decoding scheme, read and write word lines are shared. Specifically, the word lines are shared for the read and write circuits for both Port A and Port B. This eliminates two routing channels in the word line direction for each row, thus saving layout area. Also, word line decoding is simplified, since one decoder is used in place of separate read and write decoders. Moreover, having separate read and write circuits, and sharing a word line facilitates read-during-write operations. That is, the read circuit allows data to be read from the memory cell while data on the Data and N Data lines is being written to the cell by the write circuit. Since the word line is in common, both read and write circuits are selected. Also, since the write enable is an input to the column decoder instead of the word line decoder, the word line of a cell is active when that row is selected, even if the write is disabled. If the same address is reaccessed, the word line is already active, and the read delay is reduced.

According to a probability study of memory used in a microprocessor-based system, the address of the most recent visited row has the highest chance to be revisited in the next cycle. This is the basic principle behind memory caching. Accordingly, the sharing of word lines between the read and write circuits has a minimum affect on system performance. On the other hand, by sharing a word line between read and write circuits, the memory architecture is optimized, and extra bypass circuitry needed to provide the feature of read-during-write is eliminated. If the next instruction requires reaccessing the same address that has just been updated, the new data is available at the output of memory before the next cycle.

This memory cell receives a differential write data signal. That is, data to be written to Port A is placed on Data A line 742, and its complement on N Data A line 762. Data to be written to Port B is sent on Data B line 747, and its complement on N Data B line 767. This differential write decreases the time required to write to a memory cell. Data placed on the Data lines passes through the series devices to the memory cell. Since it is differential, the longest delay is through one inverter. If the write was instead single-ended to the input of the first inverter 715, and the polarity of the data was being changed, the cell would not stabilize until the first inverter transitioned, causing the second inverter to change state. Since each inverter is driven in this differential configuration, the cell stabilizes after the first inverter changes state, since the second inverter changes at the same time.

The devices in the read and write circuits are shown as NMOS devices. Alternately, the devices may be PMOS, with appropriate signal polarity changes, or a mix of NMOS and PMOS. Alternately, the devices may be bipolar, GAs, or any other suitable type device. The devices are shown as NMOS for illustrative purposes only, and as with all the figures shown, do not limit the scope of the invention, or the appended claims.

Figure 8:
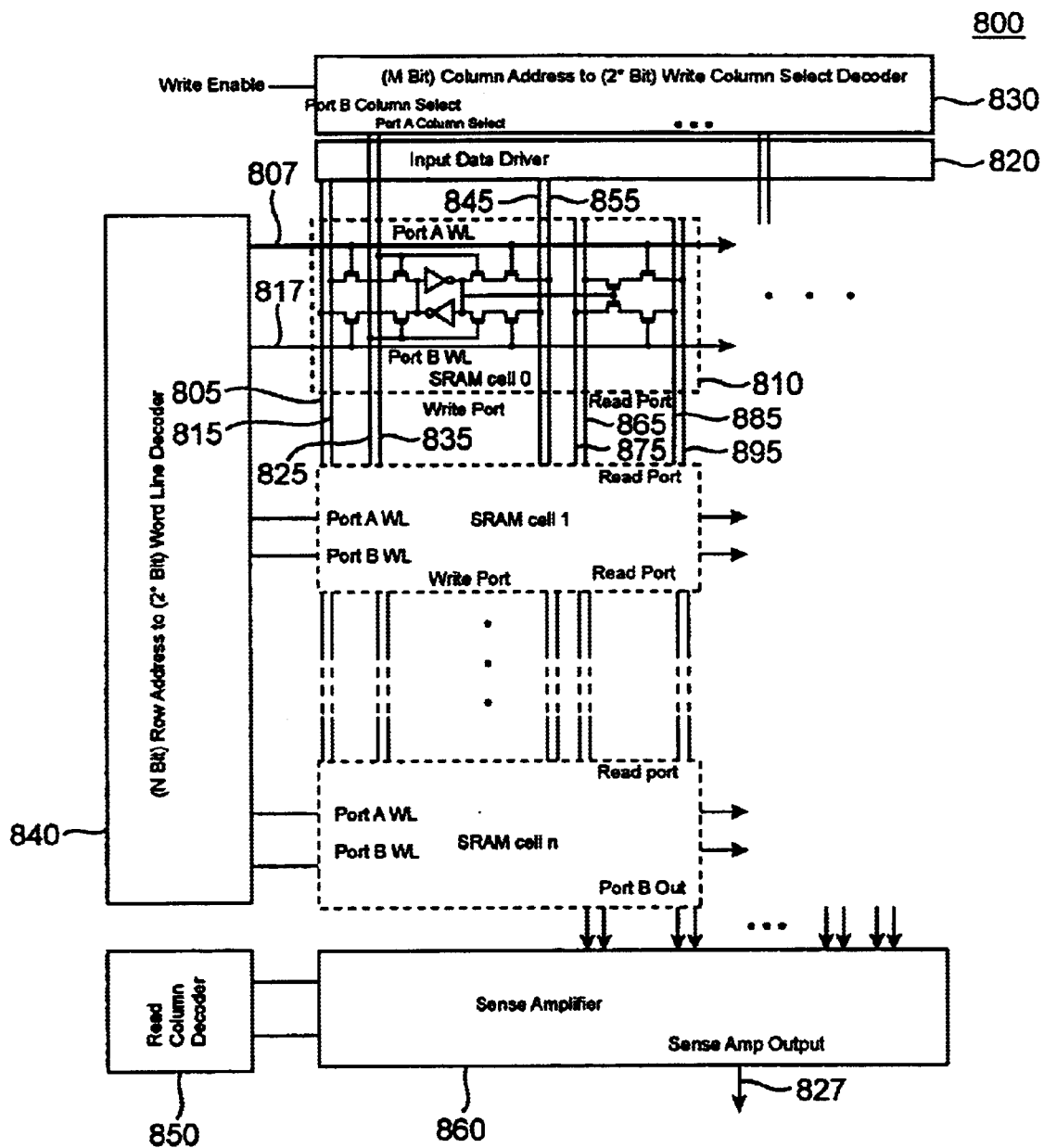
FIG. 8 is a simplified block diagram of a memory in an embedded system block in a programmable logic device according to an embodiment of the present invention.

FIG. 8 is a simplified block diagram 800 of a memory in an embedded system block in a programmable logic device according to an embodiment of the present invention. Included are a plurality of SRAM cells 810, input data driver 820, column decoder 830, row address word line decoder 840, read column decoder 850, and sense amplifiers 860. In one embodiment of the present invention there are 32 columns for a total of 32 memory cells on each word line. In this embodiment, there are 128 memory cells in the vertical direction as indicated in the figure, for a total of 4096 cells. That is, there are 128 rows of memory cells, with two word lines connected to each row. Alternately, other numbers of columns, word lines, and total cells may be used.

A number M bits of an address are decoded by column decoder 830. A write enable signal is input to the write column select decoder 830. Differential write data is provided to the memory cells 810 by input data driver 820. A number N bits of the address are decoded by word line decoder 840 and used to select word lines connected to the memory cells. Read column decoder 850 couples the sense amplifiers to the SRAM cells to be read, and sense amplifiers 860 output data on sense amplifier output lines 827.

In an embodiment of the present invention, the input data word is variable, and determined by the write column select decoder. Thus, write column select signals define the desired word size, and thus the number of memory cells to be accessed in write operations in different applications. The write column select is an address control line other than the word line decoder, and it sets the size of data to be written to a row.

A write enable signal may sent to either the word line decoder, or the write column decoder. Not having the write enable as an input to the word line decoder results in the reduction of the complexity of the word line decoder and shortens the word line wire delay. The write enable signal is not merely for disabling a normal write, and can be defined as any means that protects or isolates a row or part of a row from being written to. By placing the write enable input in the write column select decoder 830, word lines are selected even when no write operation is to take place. Again, this speeds the read operation, if a read follows this "non-write" operation. Also, in one embodiment, there are 32 columns, two column select lines for each column, one for each port, for a total 64. There are 128 rows, two word lines per row, totaling 256 word lines. Accordingly, disabling all word lines requires driving 256 inputs, while disabling the column select lines requires driving only 64. Thus, the required circuitry is simplified, at least in this example, if the column select circuitry receives the write enable input.

In an embodiment of the present invention, additional circuitry is included such that the memory may be configured as a content addressable memory (CAM). In one embodiment, the CAM uses 32 columns, and 64 word lines. One port of the memory is used, so the 64 word lines correspond to 64 rows of memory cells. The 64 rows are grouped into pairs or rows, with odd rows and neighboring even rows grouped together, specifically the first and second, the second and third, and so on. In a CAM, a data entry, for example a password, is stored. A data word, the comparand is entered. If there is a correspondence between the comparand and a data entry, a match is generated, otherwise there is a miss.

Specifically, in FIG. 8, a data entry is stored in the odd memory cells in a column. A complement of the data entry is stored in the even memory cells in the column. Since in this example there are 32 columns, 32 data entries and their complements may be stored in this way. A comparand is then input to the word lines. In this CAM configuration, the usual word line decoder circuitry is bypassed, and comparand data inputs couple directly to the word lines. Specifically, the comparand data drives the even word lines, and a complement of the comparand data drives the odd word lines. In various embodiments of the present invention, the odd and even memory cells may be reversed, and the number of entries may be different.

The parallel impedance of the read cells in each column is then determined. If the impedance is high, there is a match, if the impedance is low, there is a miss. This means that for a match, each of the read cells in the column have a high impedance. This is because if only one impedance is low in a parallel combination, the impedance of the parallel combination is low. There are two devices in series in each read cell, an inverter device M5 730 and word line device M6 735. When a word line is selected, the word line device M6 735 is activated. That is, its gate is pulled high, and since in this example it is an N-channel or NMOS device, it may conduct. Whether an activated device actually conducts depends on the voltage at its source and drains relative to its gate and each other. Thus, for the impedance to be high in a selected read cell, the data stored at the memory cell node 753 is low, shutting off or deactivating M5 730. In this procedure, the data entry is stored in memory cells connected to word lines driven by the complement of the comparand, and the complement of the data entry is stored in word lines driven by the comparand. Thus, if there is a match between the data entry and the comparand, each selected word line drives a memory cell that is storing a low, and each memory cell that is storing a high, has an inactive word line. In this way, a match is detected by the high impedance of all the read cells in the column. Since each column has a sense amplifier, a simultaneous determination of whether there is a match is made between the comparand and each of the data entries.

Also, decoder circuitry is included in the sense amplifier block 860 in one embodiment of the present invention. Thus, if a sense amplifier reads a high impedance, the location of that sense amplifier is decoded, and output as a binary word. Specifically, a 5 bit binary word is output in this example, since there are 32 data entries, one per column, and 32 sense amplifiers. In various embodiments, the location of the lowest column, the highest column, or all the columns that have a match may be decoded.

In other embodiments, the CAM may have a different number of data entries, or not all data entries may be used. The size of the data entries may vary. The devices in the read cells may alternately be PMOS devices, bipolar devices, GAs or other such devices.

This memory may also be configured as a ROM, simply by not asserting the write enable signal. Also, it may be configured as a FIFO or LIFO (last-in-first-out). For these, a counter is made of surrounding programmable logic cells, and the counter controls the word line decoder. In a typical embodiment, the memory is an SRAM.

Figure 9:
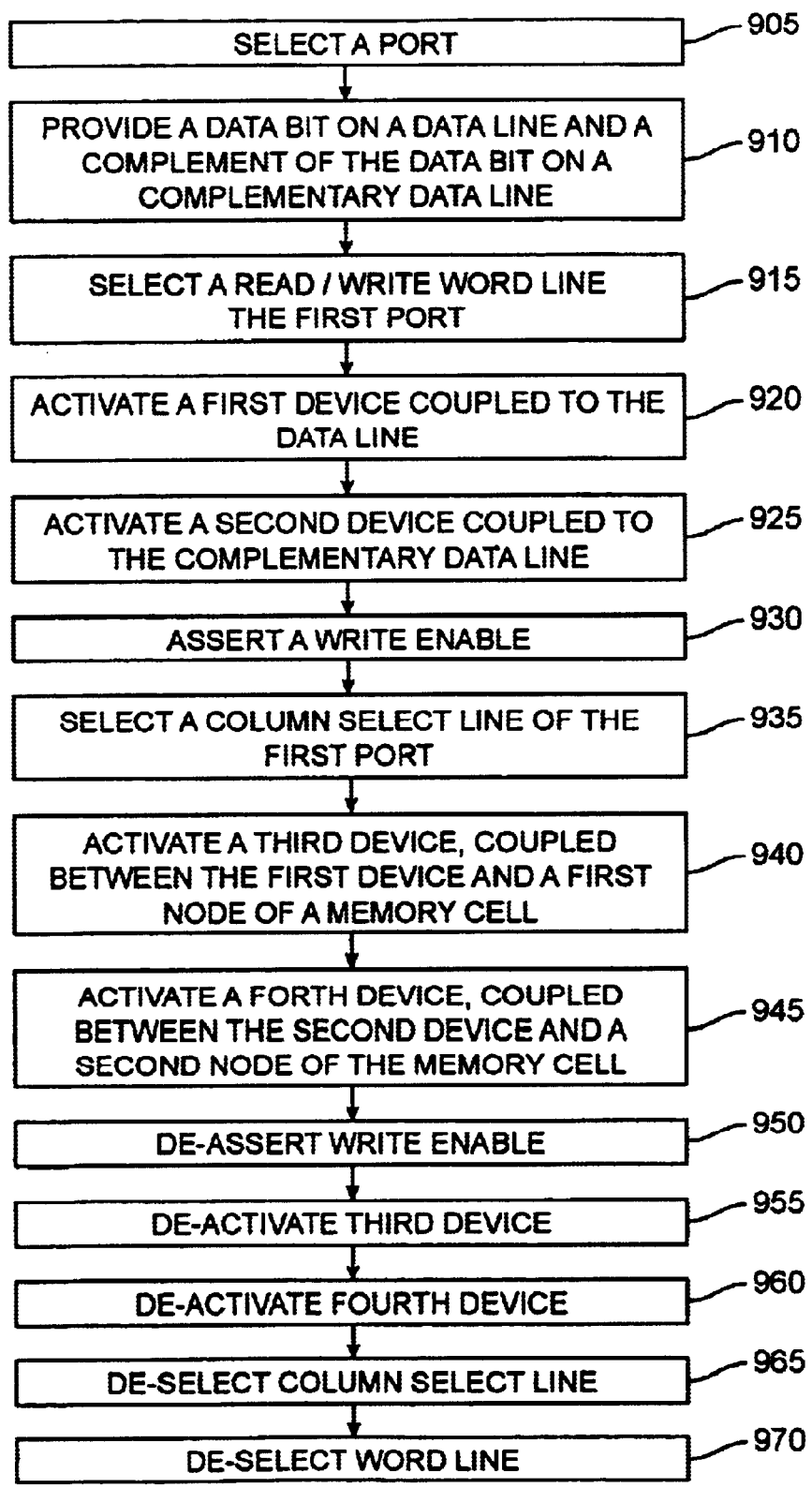
FIG. 9 is a flowchart of a method of writing to a dual-port SRAM cell consistent with an embodiment of the present invention.

FIG. 9 is a flowchart 900 of a method of writing to a dual-port SRAM cell consistent with an embodiment of the present invention. In act 905, a port is selected. In act 910, a data bit is provided on a data line and a complementary data bit is provided on a complementary data line. In act 915, a read/write word line is selected. A first device connected to the data line and a second device connected to the complementary data line and are activated in acts 920 and 925. In act 930, a write enable is asserted, and a column select line is selected in act 935. A third device connected between the first device and a first node of the memory cell is activated in act 940, and a fourth device connected between the second device and a second node of the memory cell is activated in act 945. At this time the memory cell is written to. The write enable signal is the asserted in act 950, which deactivates the third device and the fourth device in acts 955 and 960. In act 965, the column select line is deselected, and the word line is deselected in act 970.

Figure 10:
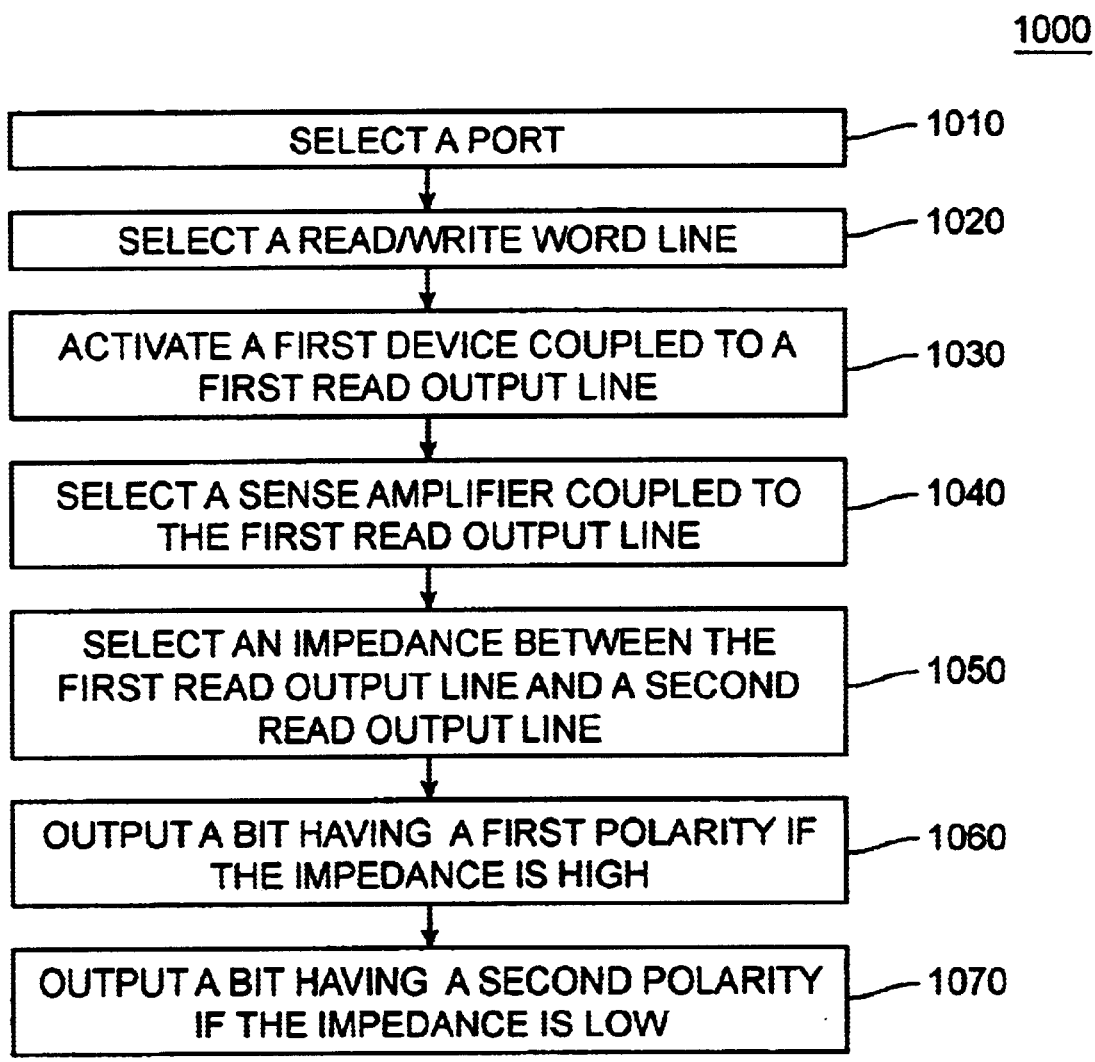
FIG. 10 is a flowchart of a method of reading data from a dual-port SRAM cell.

FIG. 10 is a flowchart 1000 of a method of reading data from a dual-port SRAM cell consistent with an embodiment of the present invention. In act 1010, a port is selected. In act 1020 a read/write word line is selected, and in act 1030 a first device connected to a first read output line is turned on. In act 1040, a sense amplifier is selected and connected to the first read output line. An impedance is sensed between the first read output line and a second read output line in act 1050. A bit having a first polarity is output if the impedance is high, and a bit having a second polarity is output if the impedance is low, in acts 1060 and 1070.

Figure 11:
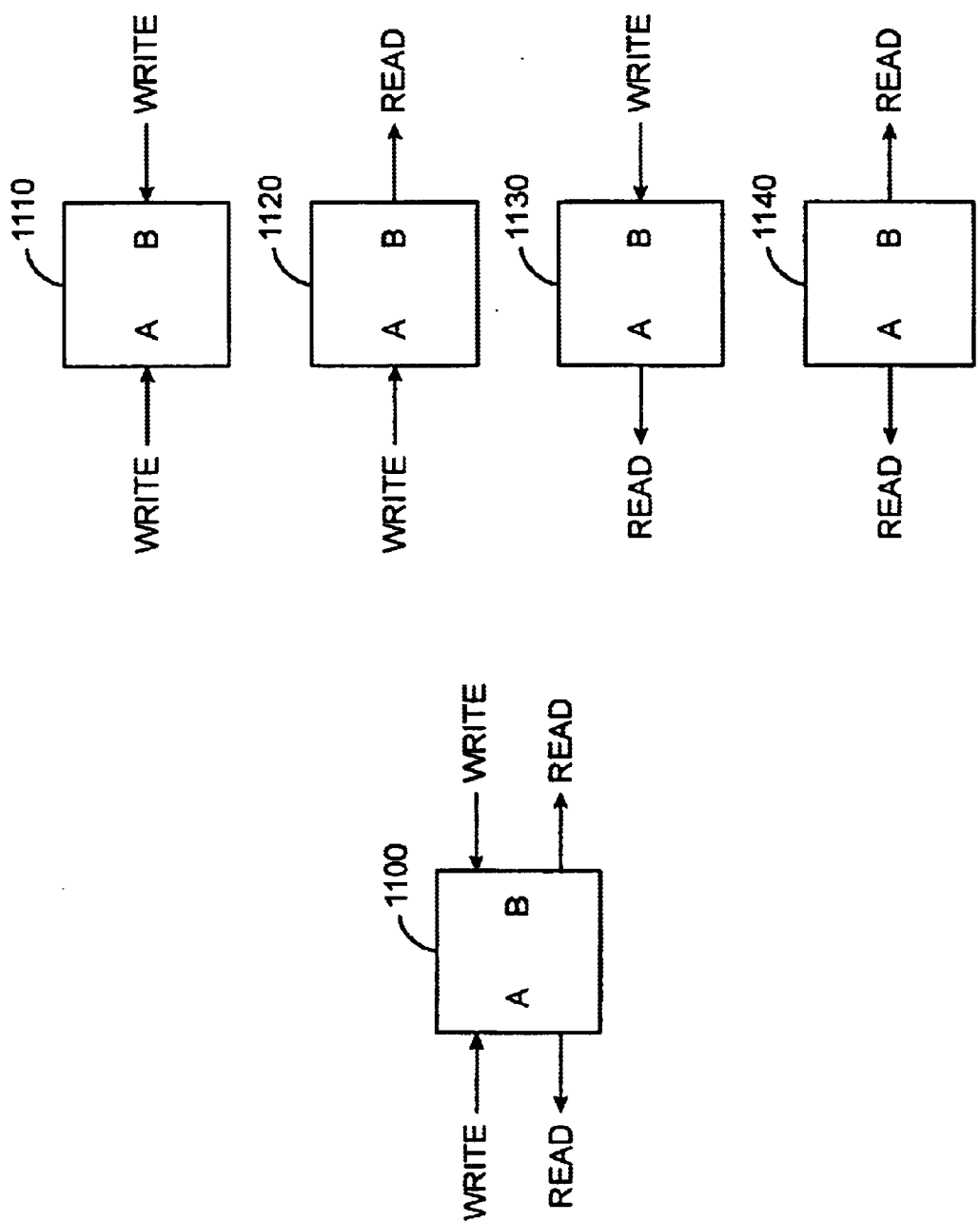
FIG. 11 is a diagram showing the possible read and write operations combinations for a memory consistent with an embodiment of the present invention.

FIG. 11 is a diagram showing the possible read and write operations combinations for a memory consistent with an embodiment of the present invention. Memory 1100 has Ports A and B, each port having an individual read and write port. This enables a write to be performed at once at both Ports A and B of memory block 1110. Alternately, a write may be simultaneously performed at Port A and a read performed at Port B of memory block 1120. Further, a read may be completed at Port A while a write is taking place at Port B of memory block 1130. Also, a read may simultaneously take place at both Ports A and B of memory block 1140.

Figure 12:
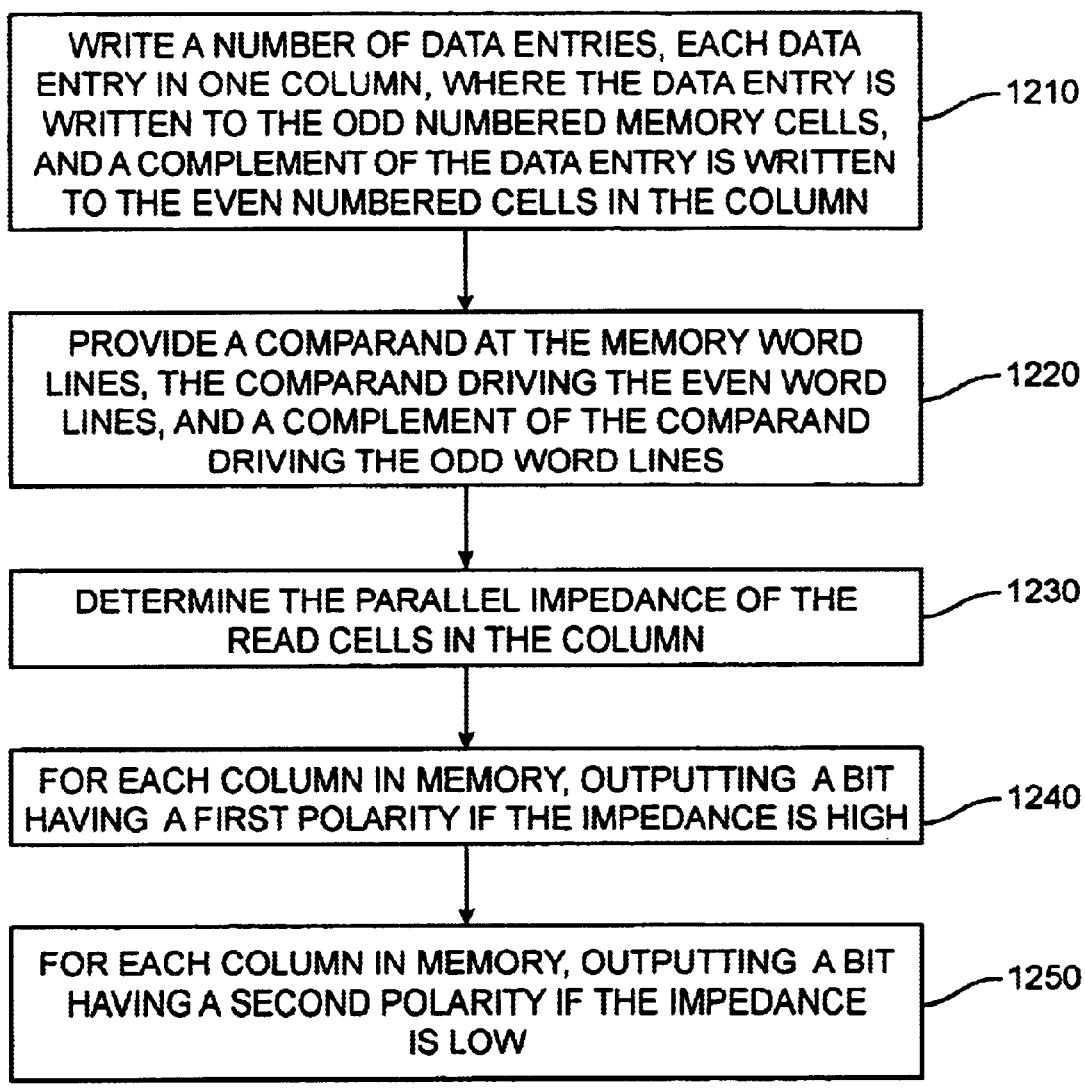
FIG. 12 is a flowchart of a method of operation of a memory according to the present invention configured as a CAM.

FIG. 12 is a flowchart 1200 of a method of operation of a memory according to the present invention that is configured as a CAM. In act 1210, a number of data entries are written. Each data entry is written to one column. The data entry itself is written to the odd numbered memory cells and a complement of the data entry is written to the even numbered cells. In acts 1220, a comparand is provided at the memory word lines. The comparand drives the even numbered word lines, and a complement of the comparand drives the odd numbered word lines. In act 1230, the parallel impedance of the read cells in the column is determined. For each column where the impedance is high, a match has occurred, and a bit having a first polarity he is output in act 1240. For each column were the impedance is low, a bit having a second polarity, the second polarity opposite the first polarity, is output.

Figure 13A:
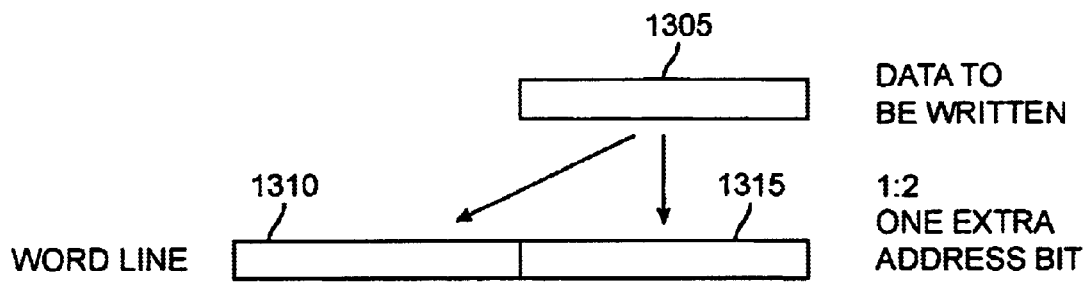
FIGS. 13A, 13B, and 13C, illustrate the multiplexing and shifting of bits at the data input of a memory consistent with embodiments of the present invention.
Figure 13B:
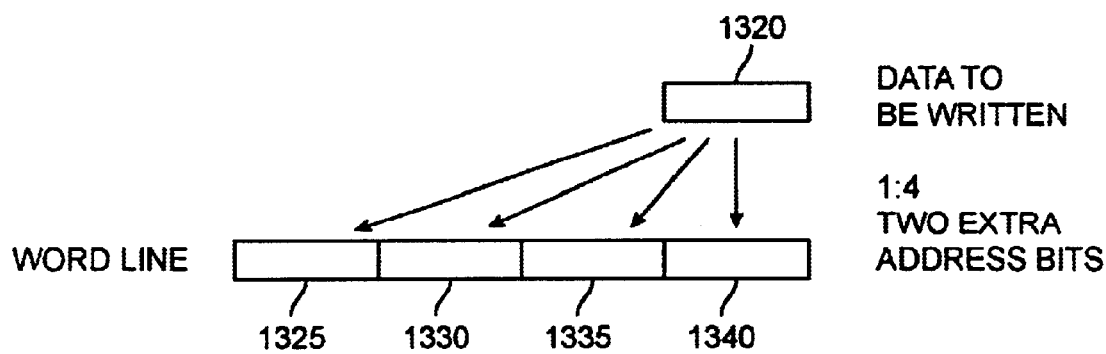
Figure 13C:
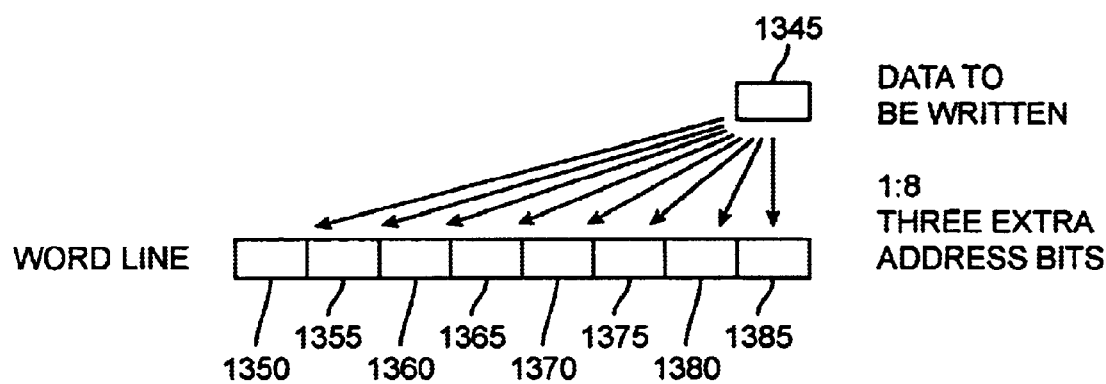

Again, in an embodiment of the present invention, the data input port is configurable to allow different sized data words. Since the number of bits in a data words is often smaller than the number of memory cells in a word line, the data words are multiplexed to various locations on a word line. FIGS. 13A, 13B, and 13C, illustrate the multiplexing and shifting of bits at the data input of a memory consistent with embodiments of the present invention. In one embodiment, these tasks are controlled by the write column select decoder.

FIG. 13A is an example of a word line made up of 32 bits, accepting data from a 16-bit wide data input 1305. Data word 1305 may be written either to word line portion 1310 or 1315. To determine this, one extra bit of address is needed to select between the two word line portions. Similarly, multiplexing and shifting in the opposite direction occurs on a read.

FIG. 13B shows the multiplexing and shifting action performed by the data input circuitry when an 8-bit word 1320 is provided. The 8-bit word 1320 may be placed in word line portion 1325, 1330, 1335, or 1340. Two extra address bits are needed to determine which word line portion input word 1320 is to be written to, or read from.

FIG. 13C is an example of the multiplexing and shifting performed at the data input for a 4-bit wide word 1345. Four bit wide word 1345 may be stored in one of eight locations, labeled 1350 through 1385. Since there are eight possible locations, three extra address bits are required to make this determination. Two input wide words, and one input wide words can also be accepted, requiring four and five extra address bits respectively. In other embodiments, non-binary wide words may be accepted. Also, the width of the word line may vary in different embodiments.

Figure 14:
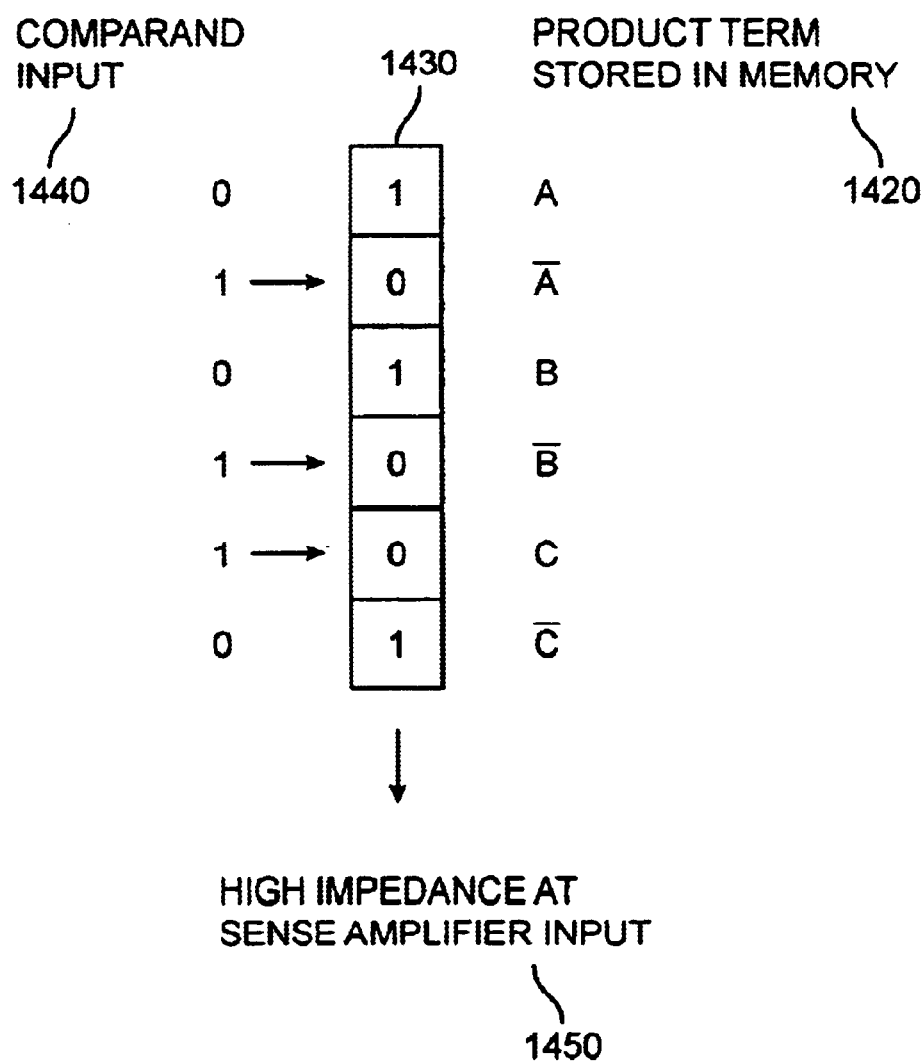
FIG. 14 is a diagram showing how a memory according to embodiments of the present invention, configured as a CAM, may be used to implement a product term.

FIG. 14 is a diagram 1400 showing how a memory according to embodiments of the present invention, configured as a CAM, may be used to implement a product term. One or more product terms may be implemented, one product term per column. For example, the product term A·B·$\overline{C}$ 1405 may be implemented in one column of memory cells. The product term is written to the odd memory cells, while a complement of the product term can be written to the even cells. Specifically, a one is written to the first cell, a one is written to the third cell, and a zero is written to the fifth cell, while a zero is written to be second cell, a zero is written to the fourth cell, and a one is written to be sixth cell. Comparand input 1440 and its complement drive the word lines connected to these memory cells. A match occurs when the comparand inputs equal to 110, since when A=1, B=1, and C=0, then A·B·$\overline{C}$=1. In this case, a one drives the word lines connected to the second, fourth, and fifth memory cells, while a zero is the word line input for the first, third, and sixth cells. Accordingly, the first, third, and sixth cells are not selected, and their read cells remain in a high impedance state. The second, fourth, and fifth cells are selected, but since they have stored a zero, their read cells also remain in a high impedance state. Since there are cells in the column that are not used in the product term, they are either disabled, or have data written to them, and the comparand input adjusted accordingly, such that the unused read cells are in a high impedance state. In one embodiment, the product term A·B·$\overline{C}$ is implemented as A·B·$\overline{C}$·D·E·F . . . where D, E, and F are forced to be a 1.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. This invention is defined by the following claims.

What is claimed is:

1. A programmable logic integrated circuit comprising:
   a dual-port memory comprising a plurality of memory storage cells, each memory storage cell comprising:
      a memory cell having a first node and a second node;
      a first plurality of devices coupled in series between a first data line and the first node of the memory cell;
      a second plurality of devices coupled in series between a second data line and the second node of the memory cell;
      a read cell coupled to the second node of the memory cell; and
      a word line coupled to a gate of a first device in the first plurality of devices, a gate of a second device in the second plurality of devices, and the read cell.

2. The integrated circuit of claim 1 wherein the first plurality of devices and the second plurality of devices each comprise two devices.

3. The integrated circuit of claim 1 wherein the first plurality of devices and the second plurality of devices each comprise two NMOS devices.

4. The integrated circuit of claim 3 wherein a gate of a third device in the first plurality of devices, and a gate of a fourth device in the second plurality of devices are coupled to a column select line.

5. The integrated circuit of claim 4 wherein a data bit at the second data line is written to the memory cell when the word line and the column select line are selected.

6. The integrated circuit of claim 5 wherein the read cell comprises a third plurality of devices, where a gate of a fifth device in the third plurality of devices is coupled to the second node of the memory cell.

7. A programmable logic integrated circuit comprising:
a dual-port memory comprising a plurality of memory storage cells, each memory storage cell comprising:
a first device coupled to a first data line, and having a gate coupled to a first word line;
a second device coupled between the first device and a fist node of a memory cell, and having a gate coupled to a first column select line;
a third device coupled to a second node of the memory cell, and having a gate coupled to the first column select line; and
a fourth device coupled between the third device and a first complementary data line, and having a gate coupled to the first word line.

8. The integrated circuit of claim 7 wherein each of the memory storage cells further comprise:
a fifth device coupled to a second data line, and having a gate coupled to a second word line;
a sixth device coupled between the fifth device and the first node of the memory cell, and having a gate coupled to a second column select line;
a seventh device coupled to the second node of the memory cell, and having a gate coupled to the second column select line; and
a eighth device coupled between the seventh device and a second complementary data line, and having a gate coupled to the second word line.

9. The integrated circuit of claim 8 wherein the memory cell comprises:
a first inverter having an input coupled to the second node of the memory cell, and an output coupled to the first node of the memory cell; and
a second inverter having an input coupled to the first node of the memory cell, and an output coupled to the second node of the memory cell.

10. The integrated circuit of claim 7 wherein the fist, second, third, and fourth devices are NMOS devices.

11. A programmable logic integrated circuit comprising:
a dual-port memory comprising a plurality of memory storage cells, each memory storage cell comprising:
a memory cell having a first node and a second node;
a first plurality of devices coupled in series between a first data line and the first node of the memory cell;
a second plurality of devices coupled in series between a second data line and the second node of the memory cell;
a read cell coupled to the second node of the memory cell; and
a column select line coupled to a gate of a first device in the first plurality of devices, and a gate of a second device in the second plurality of devices,
wherein the column select line is controlled by a write enable signal.

12. The integrated circuit of claim 11 wherein the first plurality of devices and the second plurality of devices each comprise two NMOS devices.

13. The integrated circuit of claim 12 wherein a gate of a third device in the first plurality of devices, a gate of a fourth device in the second plurality of devices, and the read cell, are coupled to a word line.

14. A programmable logic integrated circuit comprising:
a dual-port memory comprising a plurality of memory storage cells, each memory storage cell comprising:
a memory cell having a first node and a second node;
a first plurality of devices coupled in series between a first data line and the first node of the memory cell;
a second plurality of devices coupled in series between a first complementary data line and the second node of the memory cell;
a third plurality of devices coupled in series between a second data line and the first node of the memory cell;
a fourth plurality of devices coupled in series between a second complementary data line and the second node of the memory cell;
a first word line coupled to a gate of a first device in the first plurality of devices and a gate of a second device in the second plurality of devices, wherein the first device is coupled to the first data line and the second device is coupled to the first complementary data line; and
a second word line coupled to a gate of a third device in the third plurality of devices and a gate of a fourth device in the fourth plurality of devices, wherein the third device is coupled to the second data line and the fourth device is coupled to the second complementary data line.

15. The integrated circuit of claim 14 wherein each of the memory storage cells further comprise:
a read cell coupled to the second node of the memory cell.

16. The integrated circuit of claim 15 wherein each of the memory storage cells further comprise:
a first column select line coupled to a fifth device in the first plurality of devices and a sixth device in the second plurality of devices; and
a second column select line coupled to a seventh device in the third plurality of devices and an eighth device in the fourth plurality of devices.

17. The integrated circuit of claim 30 wherein the read cell further comprises:
a ninth device in series with a tenth device, a gate of the ninth device coupled to the second node of the memory cell; and
an eleventh device in series with a twelfth device, a gate of the eleventh device coupled to the second node of the memory cell.

18. The integrated circuit of claim 17 wherein a gate of the tenth device is coupled to the first word line and a gate of the twelfth device is coupled to the second word line.

19. The integrated circuit of claim 15 wherein the memory cell comprises:
a first inverter; and
a second inverter,
wherein an output of the first inverter is coupled to an input of the second inverter, and an output of the second inverter is coupled to an input of the first inverter.

20. The integrated circuit of claim 15 wherein the first, second, third, and fourth devices are NMOS devices.

21. The integrated circuit of claim 14 further comprising:
a read cell coupled to the first word line and the second word line; and
a sense amplifier coupled to the read cell.

22. A programmable logic integrated circuit comprising:
a dual-port memory comprising a plurality of memory storage cells, each memory storage cell comprising:
a memory cell having a first node and a second node;
a first plurality of devices coupled in series between a first data line and the first node of the memory cell;

a second plurality of devices coupled in series between a first complementary data line and the second node of the memory cell;
a third plurality of devices coupled in series between a second data line and the first node of the memory cell;
a fourth plurality of devices coupled in series between a second complementary data line and the second node of the memory cell;
a first word line coupled to a gate of a first device in the first plurality of devices and a gate of a second device in the second plurality of devices;
a second word line coupled to a gate of a third device in the third plurality of devices and a gate of a fourth device in the fourth plurality of devices;
a read cell coupled to the second node of the memory cell;
a first column select line coupled to a fifth device in the first plurality of devices and a sixth device in the second plurality of devices; and
a second column select line coupled to a seventh device in the third plurality of devices and an eighth device in the fourth plurality of devices.

23. A programmable logic integrated circuit comprising:
a dual-port memory comprising a plurality of memory storage cells, each memory storage cell comprising:
a memory cell having a first node and a second node;
a first plurality of devices coupled in series between a first data line and the first node of the memory cell;
a second plurality of devices coupled in series between a first complementary data line and the second node of the memory cell;
a third plurality of devices coupled in series between a second data line and the first node of the memory cell;
a fourth plurality of devices coupled in series between a second complementary data line and the second node of the memory cell;
a first word line coupled to a gate of a first device in the first plurality of devices and a gate of a second device in the second plurality of devices;
a second word line coupled to a gate of a third device in the third plurality of devices and a gate of a fourth device in the fourth plurality of devices;
a read cell coupled to the second node of the memory cell,
a fifth device in series with a sixth device, a gate of the fifth device coupled to the second node of the memory cell; and
a seventh device in series with an eighth device, a gate of the seventh device coupled to the second node of the memory cell,
wherein a gate of the sixth device is coupled to the first word line and a gate of the eighth device is coupled to the second word line.

24. An integrated circuit comprising:
a dual-port memory comprising a plurality of memory storage cells, each memory storage cell comprising:
a first device coupled to a first data line, and having a gate coupled to a first word line;
a second device coupled between the first device and a first node of a memory cell;
a third device coupled to a second node of the memory cell; and
a fourth device coupled between the third device and a first complementary data line, and having a gate coupled to the it word line.

25. The integrated circuit of claim 24 wherein a gate of the second device and a gate of the third device are coupled to a first column select line.

26. The integrated circuit of claim 25 wherein each of the memory storage cells further comprise:
a fifth device coupled to a second data line, and having a gate coupled to a second word line;
a sixth device coupled between the fifth device and the first node of the memory cell, and having a gate coupled to a second column select line;
a seventh device coupled to the second node of the memory cell and having a gate coupled to the second column select line; and
an eighth device coupled between the seventh device and a second complementary data line, and having a gate coupled to the second word line.

27. The integrated circuit of claim 26 wherein the memory cell comprises:
a first inverter having an input coupled to the second node of the memory cell, and an output coupled to the first node of the memory cell; and
a second inverter having an input coupled to the first node of the memory cell, and an output coupled to the second node of the memory cell.

28. The integrated circuit of claim 24 further comprising:
a read cell coupled to the first word line; and
a sense amplifier coupled to the read cell.

29. An integrated circuit comprising:
a dual-port memory comprising a plurality of memory storage cells, each memory storage cell comprising:
a first device coupled to a first data line;
a second device coupled between the first device and a first node of a memory cell, and having a gate coupled to a first column select line;
a third device coupled to a second node of the memory cell, and having a gate coupled to the first column select line; and
a fourth device coupled between the third device and a first complementary data line.

30. The integrated circuit of claim 29 wherein a gate of the first device and a gate of the fourth device are coupled to a first word line.

31. The integrated circuit of claim 30 wherein each of the memory storage cells further comprise:
a fifth device coupled to a second data line, and having a gate coupled to a second word line;
a sixth device coupled between the fifth device and the first node of the memory cell and having a gate coupled to a second column select line;
a seventh device coupled to the second node of the memory cell, and having a gate coupled to the second column select line; and
an eighth device coupled between the seventh device and a second complementary data line, and having a gate coupled to the second word line.

32. The integrated circuit of claim 31 wherein the memory cell comprises:
a first inverter having an input coupled to the second node of the memory cell, and an output coupled to the first node of the memory cell; and
a second inverter having an input coupled to the first node of the memory cell, and an output coupled to the second node of the memory cell.

33. The integrated circuit of claim 32 further comprising:
a read cell coupled to the first word line; and
a sense amplifier coupled to the read cell.

* * * * *